(12) United States Patent
De Peuter et al.

(10) Patent No.: US 8,117,361 B2
(45) Date of Patent: *Feb. 14, 2012

(54) DYNAMIC COMPRESSION OF SYSTEMS MANAGEMENT DATA

(75) Inventors: Geert De Peuter, Turnhout (BE); David Bonnell, Berkshire (GB)

(73) Assignee: BMC Software, Inc., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/816,426

(22) Filed: Jun. 16, 2010

(65) Prior Publication Data

US 2010/0257147 A1     Oct. 7, 2010

Related U.S. Application Data

(63) Continuation of application No. 11/956,489, filed on Dec. 14, 2007, now Pat. No. 7,765,346.

(51) Int. Cl.
G06F 13/38   (2006.01)
(52) U.S. Cl. .......................... 710/68; 707/101
(58) Field of Classification Search .................. None
See application file for complete search history.

(56) References Cited

U.S. PATENT DOCUMENTS

| | | | | |
|---|---|---|---|---|
| 6,300,887 B1 * | 10/2001 | Le | ................................... | 341/60 |
| 6,309,424 B1 * | 10/2001 | Fallon | ............................. | 341/51 |
| 6,560,647 B1 * | 5/2003 | Hafez et al. | ..................... | 709/224 |
| 6,757,432 B2 * | 6/2004 | Hijiri et al. | ..................... | 382/232 |
| 7,076,402 B2 * | 7/2006 | Williams | ....................... | 702/189 |
| 7,111,142 B2 * | 9/2006 | Spencer et al. | ............... | 711/170 |
| 7,228,323 B2 * | 6/2007 | Angerer et al. | ............... | 708/203 |
| 7,420,992 B1 * | 9/2008 | Fang et al. | ..................... | 370/477 |
| 2006/0195464 A1 * | 8/2006 | Guo | .............................. | 707/101 |
| 2008/0071818 A1 * | 3/2008 | Apanowicz et al. | .......... | 707/101 |

OTHER PUBLICATIONS

Jessica Lin, Eamonn Keogh, Stefano Lonardi, and Bill Chiu. 2003. A symbolic representation of time series, with implications for streaming algorithms. In Proceedings of the 8th ACM SIGMOD workshop on Research issues in data mining and knowledge discovery (DMKD '03). ACM, New York, NY, USA, 2-11.*

Mohamed Medhat Gaber, Arkady Zaslavsky, and Shonali Krishnaswamy. 2005. Mining data streams: a review. SIGMOD Rec. 34, 2 (Jun. 2005), 18-26.*

Graefe, G.; Shapiro, L.D.; , "Data compression and database performance," Applied Computing, 1991., [Proceedings of the 1991] Symposium on , vol., No., pp. 22-27, Apr. 3-5, 1991 doi: 10.1109/SOAC. 1991.143840 URL: http://ieeexplore.ieee.org/stamp/stamp.jsp?tp=&arnumber=143840&isnumber=3857.*

* cited by examiner

Primary Examiner — Tariq Hafiz
Assistant Examiner — Dayton Lewis-Taylor

(57) ABSTRACT

A method, system, and medium for compressing systems management information in a historical data store. Dynamically determining the appropriate compression algorithm to apply based on the type of data being compressed and stored. As further input is received for any particular measurement, the appropriate compression algorithm will be automatically selected from the set of available compression algorithms or be defined by a user configuration parameter. The amount of historical data stored with the minimal amount of data loss is optimized by the system dynamically changing the compression algorithm used for the given input data over a particular time span. The system engineer is therefore presented with the pertinent information for monitoring, administrating and diagnosing system activities.

27 Claims, 4 Drawing Sheets

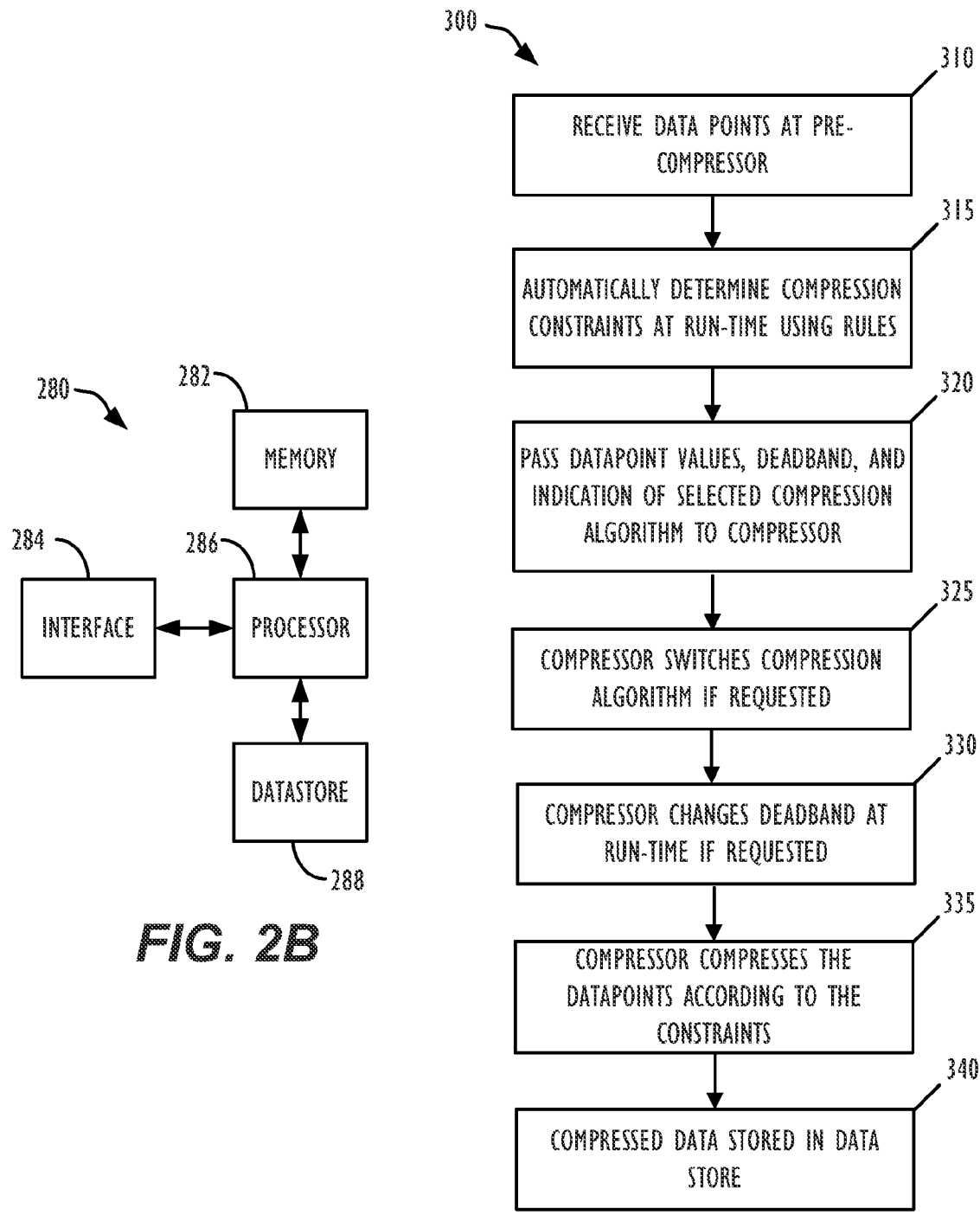

DYNAMIC COMPRESSION OF SYSTEMS MANAGEMENT DATA

CROSS REFERENCE TO RELATED APPLICATIONS

This is a continuation application of U.S. patent application Ser. No. 11/956,489 by Geert De Peuter et al. entitled "Dynamic Compression of Systems Management Data" filed 14 Dec. 2007 which is incorporated by reference herein in its entirety.

BACKGROUND

The present disclosure relates generally to compressing systems management data without excessive loss of original detail, more particularly but not by way of limitation, to a method and system for dynamically selecting compression settings according to the data being collected.

To improve storage or transmission efficiency, data compression stores data in a format that requires less space than required to store the original raw data. Data compression can be lossless or lossy. Lossless compression of time series data can be impractical due to the typically high overhead. For example, using run length encoding or dictionary-based compression may require a dictionary or large buffer to be maintained and may require great care to avoid data loss. Lossy data compression does not store all of the data and instead discards data deemed irrelevant, thereby reducing the overall amount of data stored. However, potentially valuable information may be lost in the process.

Although different forms of data compression have been used in chemical process control or the like, using data compression for systems management data poses special challenges due to the very dynamic nature of the data. In FIG. 1, an enterprise computing environment 100 has many different types of computer and network components. Each of these diverse components requires monitoring and collection of time series data for historical analysis to aid in problem diagnosis or other system management functions such as capacity planning. For example, CPU utilization on one system 110 is very unlikely to behave in the same way as CPU utilization on another system 120. Similarly, disk utilization measurements may vary widely across the different disk units 130 in the enterprise computing environment 100. Moreover, each component of the environment 100 may have to be measured using a different scale. For example, CPU utilization may be measured in the range 1-100 and reflect a percentage of CPU usage, whereas a disk unit may be measured in a virtually unlimited range reflecting the amount of free space available.

As expected, systems management produces large quantities and diverse forms of time series data that may need to be retained for historical reference. Storing all of the raw data is potentially unfeasible. Therefore, some form of data compression may be necessary to limit the storage space required or to reduce the amount of I/O required to store the data. Traditionally, compression of systems management data typically uses geometric averaging to reduce the granularity of the stored data over time. While this type of compression is effective at reducing the volume of data stored, it loses much of the detail of the original data, which is especially true when time series data is filtered according to a compression ratio.

Defining appropriate compression deadbands for systems management data is difficult due to the diverse systems management data collected in the environment 100. For example, a chemical process can have a maximum deviation defined for every measurement because hardware sensors operate within precisely defined tolerances to collect measurements and the collected measurements are largely invariant due to steady state operation. In systems management, establishing a maximum deviation acceptable for every metric is impractical because no "specific sensors" exist.

In systems management, components of the environment 100 and their metrics may also be discovered dynamically. For example, when a hard drive is added to the system, new metric data will be made available related to that hard drive. In addition, metrics may be measured according to various scales, ratios, measurements, etc. For example, a metric indicative of the amount of free memory can be measured in either megabytes or gigabytes, and specifying a tolerance band of ±1000 bytes can be very unacceptable for a small machine but acceptable for very large servers. Moreover, requiring a user to manually configure an appropriate deadband for each metric measured on each component of the environment 100 is impractical, especially when the enterprise computing environment 100 is diverse, complex, or dynamic.

SUMMARY

System management data is efficiently compressed by selecting an appropriate compression algorithm based on the type of time series data being monitored. The potential exists that the incoming data will change its characteristics over time or for periods of time. Invariantly applying a single compression algorithm may therefore not achieve the most efficient compression of the data. As the data is monitored, different compression algorithms are selected for data points of the same metric. By adaptively selecting a compression algorithm and the compression settings most appropriate for the characteristics of the metric data currently being received, more efficient compression of time series system management data can be achieved. Ultimately, the more efficient compression minimizes the amount of storage required while at the same time also minimizing the error introduced into the compressed data by the application of the compression algorithm.

BRIEF DESCRIPTION OF THE DRAWINGS

FIG. 2B illustrates an apparatus performing the method according to the present disclosure.

FIG. 3 is a flowchart illustrating a process for compressing systems management data using the compression system of FIG. 2.

DETAILED DESCRIPTION

Figure 2A:
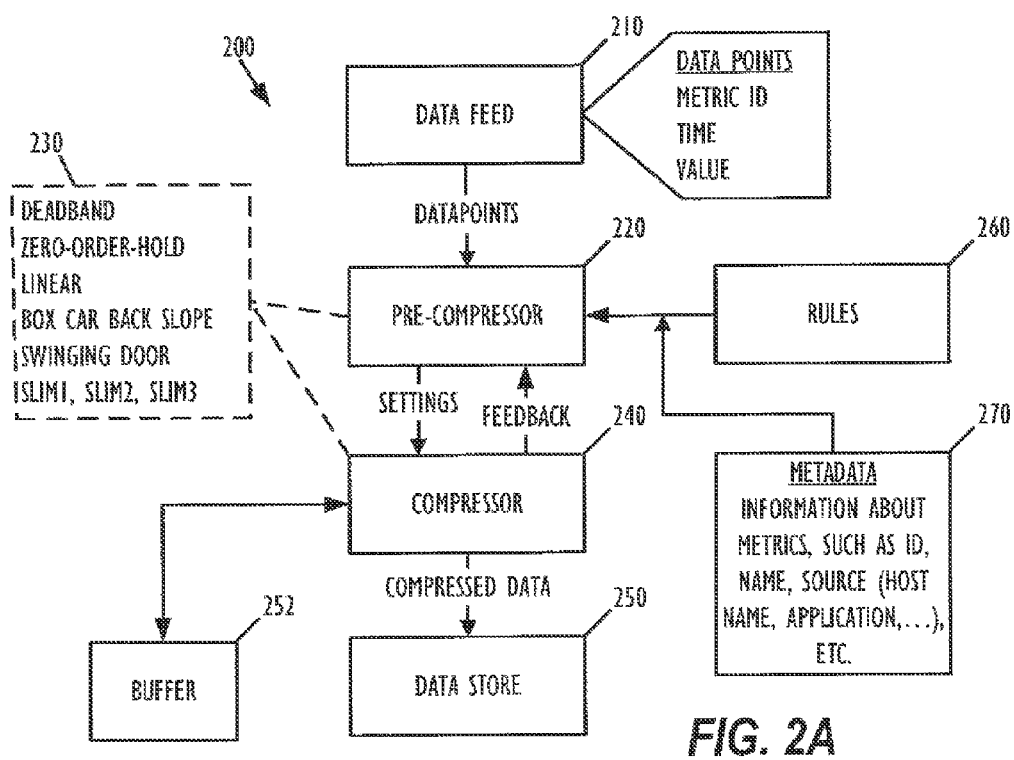
FIG. 2A schematically illustrates a compression system according to the present disclosure.

A dynamic compression system 200 according to the present disclosure illustrated in FIG. 2 compresses incoming metric data for systems management and stores the compressed data in a repository or data store 250. Data store 250 may be any suitable output device including memory, a non-volatile data storage device such as a hard disk, and a network interface. To compress the metric data, system 200 performs a dynamic compression process 300 such as illustrated in FIG. 3. System 200 has a pre-compressor 220 and a compressor 240 that operate in tandem. Pre-compressor 220 determines how to compress the incoming metric data and passes setting information to compressor 240. In turn, compressor 240 compresses that data using an appropriate one of a plurality of available compression algorithms 230 and compression settings determined by pre-compressor 220. Definitions and details related to compression algorithms referenced herein are provided at the end of this disclosure.

System 200 can be embodied as software modules executing on one or more computers or network servers, or as an apparatus 280 having a processor 286, a memory 282, an interface 284 and a datastore 288 as in FIG. 2B. Interface 284 receives the metric data. Processor 286 executes dynamic compression system 200, retrieving compression algorithms and rules from memory 282, datastore 288, or interface 284. Processor 286 then stores the compressed metric data in either memory 282 or datastore 288 or sends it over interface 284.

Initially in process 300 of FIG. 3, metric data is fed into pre-compressor 220 via a data feed 210 (Block 310). In general, the metric data includes data points having a metric ID uniquely identifying the metric to which the data pertains, a time at which the metric was measured, and a value of the metric. The metric ID may be a single attribute or a combination of attributes that together uniquely identifies the metric. The metric data may also contain additional metadata to be used by pre-compressor 220 in evaluating rules 260.

Logic in pre-compressor 220 applies rules 260 to the incoming metric data to dynamically determine constraints for compressing the data (Block 315). These settings include an appropriate one of a plurality of compression algorithms 230 for compressing the metric data and an appropriate one of a plurality of settings for the selected compression algorithm, such as a deadband.

To determine the constraints, pre-compressor 220 applies rules 260 to the values of the metric data to make the dynamic determination. Alternatively, pre-compressor 220 evaluates certain metadata 270 associated with the incoming metric data to dynamically determine the constraints for compressing the metric data. Metadata 270 includes information about the metric, such as its ID, its name, its source (host name, application, . . . ), and other like information. The metric ID is used to associate incoming metric data with any corresponding metadata. Furthermore, pre-compressor 220 can use both metadata 270, metadata contained in the metric data, and the values of the metric data to determine how the metric data should be compressed.

After determining the compression constraints, pre-compressor 220 passes the metric data to compressor 240 along with the dynamically determined constraints (Block 320). To process the incoming metric data at run-time, compressor 240 may first be instructed or requested to switch from a currently used compression algorithm to another algorithm (Block 325). In addition, compressor 340 may be instructed to change the settings being used for the compression of the incoming metric data at run-time (Block 330). After receiving the constraints, compressor 240 compresses the incoming metric data using the constraints provided to it by pre-compressor 220 (Block 335) and stores the compressed data in a data store 250 (Block 340). In storing the compressed data, compressor 240 can use a temporary storage buffer 252 to hold metric data as it is being either retained or discarded.

Several types of compression algorithms known in the art can be selected by pre-compressor 220 and used by compressor 240. Some suitable compression algorithms 230 include, but are not limited to, Deadband, Zero-Order-Hold, Linear, Box Car Slope, Swinging Door, and fan interpolator techniques as in Straight Line Interpolation Methods (e.g., SLIM1, SLIM2, and SLIM3) compression algorithms. Having several available compression algorithms 230 requires system 200 to have multiple programmable settings. For example, although a Zero-Order-Hold compression algorithm may not require any programmable settings at all, a fan interpolator or swinging door compression algorithm may require different settings. Accordingly, pre-compressor 220 produces and passes settings necessary for compressor 240 to employ a selected one of the compression algorithms 230 without compressor 240 having to select the actual algorithm or settings.

As noted above, one embodiment of pre-compressor 220 uses the values of the incoming metric data itself to dynamically determine the compression constraints to apply. To do this, pre-compressor 220 uses the actual values of the metric data being collected as an indication of what kind of system metric returns such values. For example, pre-compressor 220 determines that metric data having values of only 0's and 1's indicates that the corresponding metric returns a Boolean state, that metric data having values between 0 and 100 indicates the metric returns a percentage, and that even larger values indicate that the metric measures raw values, such as available memory available, file system capacity, etc. Based on such heuristics, pre-compressor 220 dynamically configures compression settings to minimize the error introduced into the compressed data by the application of the compression algorithm 230 used.

In one embodiment, rules 260 applied by pre-compressor 220 to the incoming values can define different settings for specific metrics. For example, for a metric that returns values from a predefined enumeration, pre-compressor 220 can select a Zero-Order-Hold compression algorithm for that metric. For yet another metric that returns rather large values, pre-compressor 220 can select a swinging door compression algorithm with an appropriate deadband for that metric. Apart from evaluating the values themselves, compression system 200 may use metadata such as the name or source of a collected metric to determine which compression settings are most appropriate for that metric.

Illustrative logic for rules 260 that can be used by pre-compressor 220 to evaluate the incoming values and select an appropriate compression algorithm 230 based on those values can resemble the following:

```
# For integer values, use zero-order-hold
if value>=0 and value<100 and is_integer(value)
then return(compression:zero-order-hold)
# For non integer values, use slim3 with a deadband of 0.5%
if value>=0 and value<100
then return(compression:slim3,deadband:value*0.5%)
# For values greater than 10000, just require 3 digits precision
if value>=10000
then return(compression:slim3, deadband:3digits)
# For any value greater than 100, less than 10000
# use a 1% deadband
if value>=100
then return(compression:slim3, deadband:value*1%)
# Fall through, use an absolute deadband of 1
return(compression:slim3, deadband:1)
```

In this example, the logic determines whether the incoming value is an integer or non-integer. For integer values greater than or equal to "0" and less than "100," the logic assigns a Zero-Order-Hold compression algorithm 230 for processing of the value by the compressor 240. For non-integer values greater then or equal to "0" and less than "100," the logic assigns a SLIM3 compression algorithm with a deadband of 0.5%. For values greater than or equal to 10000, the logic assigns a SLIM3 compression algorithm with a three digits precision. For any value greater than 100 and less than 10000, the logic assigns a SLIM3 compression algorithm with 1% deadband. For all other values, the logic assigns a SLIM3 compression algorithm with an absolute deadband of 1. The use of such logic allows dynamic compression definitions to be predefined. As will be appreciated with the benefit of the present disclosure, various other rules then those shown in the example can be applied to various values of the incoming metric data to select a compression algorithm for use by the compressor 240 depending on the implementation of system 200.

As noted above, another embodiment of pre-compressor 220 of FIG. 2 applies rules 260 to metadata 270 of the incoming metric data to dynamically determine how the data should be compressed. In this embodiment, pre-compressor 220 automatically determines optimal compression constraints at run-time by evaluating the collected metric data and its associated metadata 270 with rules 260. From this operation, pre-compressor 220 selects an appropriate compression algorithm and settings for that algorithm from a set of compression algorithms 230. Illustrative logic for such an embodiment can resemble the following:

For metrics with a name ending in "Status", expect an
    # enumerated value that requires a zero-order-hold compression
       if regexpmatch(name, "Status$")
       then return(compression:zero-order-hold)
    # For metrics referencing a percentage value, use swinging door
    # compression with a 0.5 deadband
       if regexpmatch(name, "Pct")
       then return(compression:swinging-door, deadband: 0.5)

In this example, the logic assigns Zero-Order-Hold compression for any incoming metrics with a name ending in "Status." In another example, the logic assigns a swinging door compression with a 0.5 deadband for incoming metrics referencing a percentage. In addition to these, metadata 270 associated with or contained in the metric data for a given metric that can be used in such assessments includes, but is not limited to, metric ID, name, label, timestamp (or time of day), value, last value, instance/element, hostname, application, etc. As will be appreciated with the benefit of the present disclosure and depending on the implementation of the system 200, various other rules 260 then those shown in these examples can be applied to various other forms of attributes and metadata 270 associated with the incoming metric data to select a compression algorithm 230 for use by the compressor 240.

In another embodiment, pre-compressor 220 may use rules 260, metadata 270, and feedback information from compressor 240 to dynamically adjust compressor settings or the selected compressor algorithm 230. For example, if the current compression ratio achieved by compressor 240 for the current metric is less than a minimum required compression ratio defined by rules 260 or metadata 270, then pre-compressor 220 instructs compressor 240 to more aggressively compress the metric data by using a different algorithm 230 or settings, such as a wider deadband, in order to ensure that a minimum compression ratio is achieved. In another example, if the current compression ratio achieved is greater than a maximum required compression ratio, then pre-compressor 220 instructs compressor 240 to less aggressively compress by using a different algorithm or settings, such as a narrower deadband, in order to increase accuracy (reduce error). In yet another example, if the time at which a last data point for the current metric was stored is greater than a defined limit, then pre-compressor 220 instructs compressor 240 to store the raw value in datastore 250.

In addition to evaluating the values, attributes, and metadata associated with incoming metric data, rules 260 for pre-compressor 220 can determine whether to turn compression off by specifying a null compressor. Turning off compression may be useful if a rule 260 determines that an incoming value crosses a threshold or would otherwise be flagged by the system or system administrator for special treatment. In this way, pre-compressor 220 can intelligently veto data compression of such significant data points and force system 200 to store the raw value in data store 250.

Rules 260 for pre-compressor 220 can also choose to store additional metadata 270 for later use. For example, if a floating point value has been encountered for an incoming metric, and pre-compressor 220 has selected a SLIM3 compression algorithm to compress the data, then pre-compressor 220 can store this decision as metadata 270. In this way, pre-compressor 220 applying the particular rule 260 can recall the decision and avoid an attempt to switch back to a Zero-Order-Hold compression algorithm and possibly compromise the achievable compression ratio.

When the compression constraints are passed from pre-compressor 220 to compressor 240 in process 300 of FIG. 3, compressor 240 may be required to switch compression algorithms 230 as indicated in Block 325. To change the compression algorithm 230 at run-time, compressor 240 first takes whatever steps are necessary to terminate the active compression algorithm 230 of the metric, including possibly flushing any pertinent data stored in buffer 252 to data store 250. This simply means that the last received data point will be written out to close the compression range in data store 250 and is essentially the same process that occurs when a new metric value falls outside of a compression deadband.

Figure 4A:
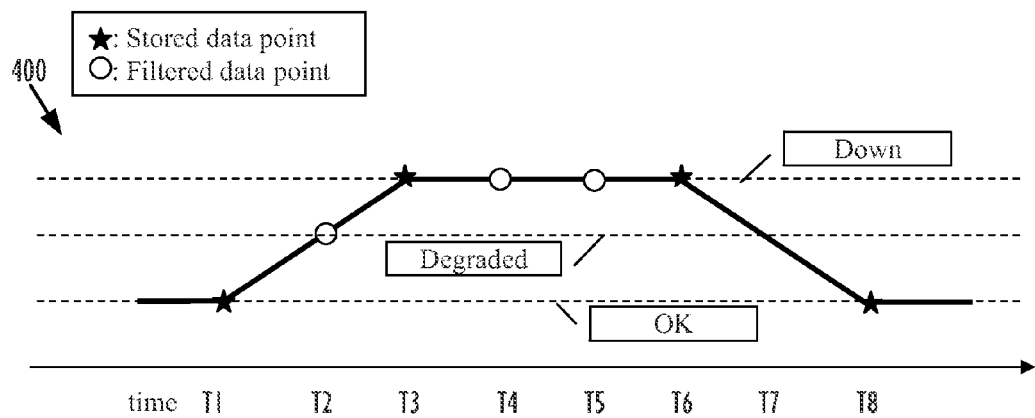
FIG. 4A illustrates an example timeline of metric data points having digital values.

As noted above, dynamic compression system 200 can apply one of several compression algorithms 230 according to the constraints determined by pre-compressor 220. As shown in FIG. 4A, an example timeline 400 has metric data points that represent discrete states (e.g., OK, DEGRADED, DOWN). To compress such digital values, pre-compressor 220 can select a small deadband or can select a Zero-Order-Hold algorithm.

In FIG. 4A, compressor 240 stores data points at time t1, t3, t6, and t8. However, compressor 240 need not store data point at t2 because the DEGRADED state logically lies between the OK and DOWN states. Likewise, compressor 240 discards the OK states at times t4 and t5 because they fall on the hold line between the OK states at times t3 and t6. At t7, however, no data point was reported, possibly due to an anomaly in the monitoring system. When the graph is reconstructed from the compressed data, it is not possible to determine whether the value at t7 was collected or not. Knowing of a missing data point may be crucial for certain types of metrics (e.g., a heartbeat).

Figure 4B:
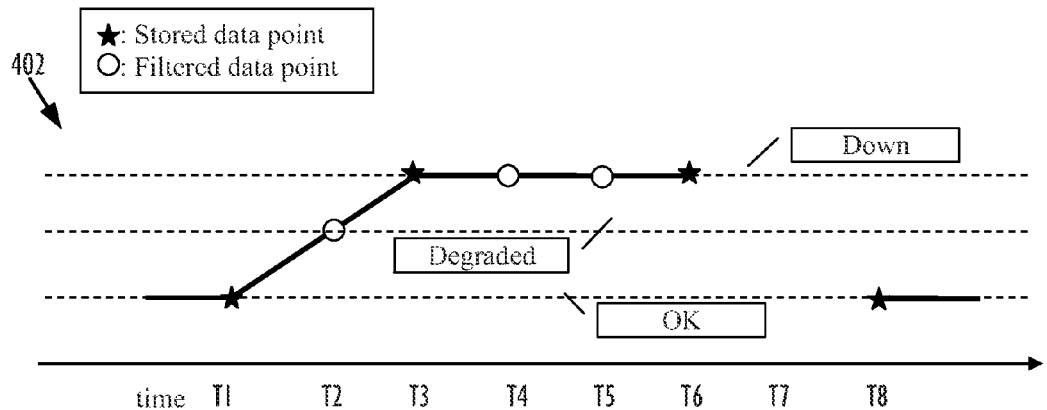
FIG. 4B illustrates an example timeline of metric data points having digital values and a detected GAP.

Rules 260 using metadata 270 may instruct pre-compressor 220 to determine that the data point at t7 was not collected and to then instruct compressor 240 to store in datastore 250 an indication of a gap in the collected data. FIG. 4B shows the proper reconstruction of the data obtained from the compressed data and gap indicators stored in datastore 250. The gap indicator can be a binary value recorded in a column of a historical table to indicate where a gap starts or to flag where the last properly collected value occurred.

Figure 4C:
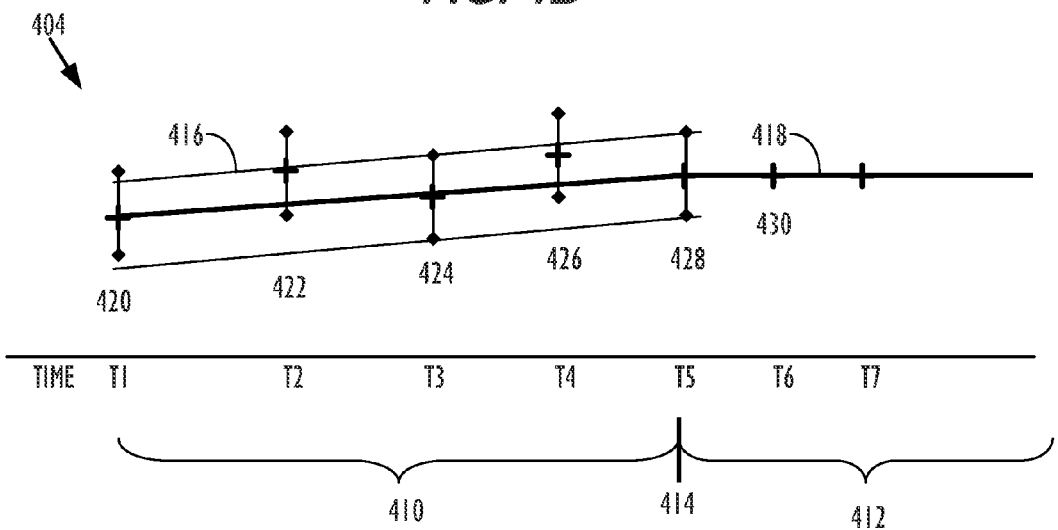
FIG. 4C illustrates an example timeline of metric data points in which the compression algorithm is dynamically changed from Deadband to Zero-Order-Hold.

As noted previously, compression system 200 can dynamically change compression algorithm 230 in real-time. Depending on which compression algorithms 230 are being switched, compression system 200 may retain certain data points that would not ordinarily be retained. For illustration, timeline 404 in FIG. 4C shows collected data points 420-430 and shows a change in compression algorithm from Deadband in time range 410 to Zero-Order-Hold in time range 412. Switch point 428 at time 414 represents the data point and time where the switch of compression algorithms occurred. For Deadband compression in range 410, data point 428 behaves as the last point in the previous Deadband compression and as the first data point for the Zero-Order-Hold in range 412. Accordingly, the system regains data point 428. During the Deadband compression in range 410, however, the system suppresses incoming data points 420-426 because they fall within the deadband 416 relative to starting point 420 and ending point 428. Likewise, data point 430 in the second range 412 is suppressed because it falls on the Zero-Order-Hold line 418.

To switch compression algorithms 230, pre-compressor 220 can pass a mandatory command to compressor 240 to change compression algorithms 230. Such a mandatory change may be the default setting for compression changes that compressor 240 immediately performs. Alternatively, pre-compressor 220 can pass a suggestion to compressor 240 to change compression algorithms 230 depending upon current operating parameters. In this circumstance, rules 260 for pre-compressor 220 allow pre-compressor 220 to pass a suggested switch in compression algorithms 230 to compressor 240. In turn, compressor 240 can decide to switch compression algorithms 230 immediately or delay the change.

For example, incoming metric data may be a continuous stream of "1's" collected at regular time intervals. According to a dynamic determination, pre-compressor 220 may suggest changing the compression algorithm from Zero-Order-Hold to Swinging Door compression algorithm. As values of 1's keep coming into system 200, however, compressor 240 can delay changing the algorithm to Swinging Door because doing so would not add any benefit. In fact, the change would arguably decrease data quality because Zero-Order-Hold has no tolerance. Later, pre-compressor 220 may suggest a switch back from its previously suggested change. Having deferred the original switch, however, compressor 240 can avoid unnecessarily storing data points at the time of the original request.

As noted previously, dynamic compression system 200 can dynamically select between several compression algorithms 230 depending on circumstances and incoming data points. In selecting compression algorithms 230 for system management data, certain characteristics of each algorithm need to be considered to evaluate the algorithms suitability. For example, some fan interpolators store pseudo (interpolated) data points, which may be undesirable. The Box Car Back Slope algorithm has a higher processing overhead than many other algorithms and may for that reason be undesirable in a large scale system.

Preferably, a default compression algorithm for systems management data is the SLIM3 algorithm, which may have settings such as follows:

Value<=0: deviation=1% (relative);

Value>0 AND <=10: deviation=0.3 (absolute);

Value>10 AND <=100: deviation=0.5 (absolute); and

Value>100: deviation=1% (relative).

A more conservative model may set the SLIM3 deviation to 0 (absolute) regardless of the value, and pre-compressor 220 can change the tolerance band for each value that arrives. At the same time, however, compressor 240 preferably monitors thresholds and does not compress data that crosses a defined threshold.

Figure 5:
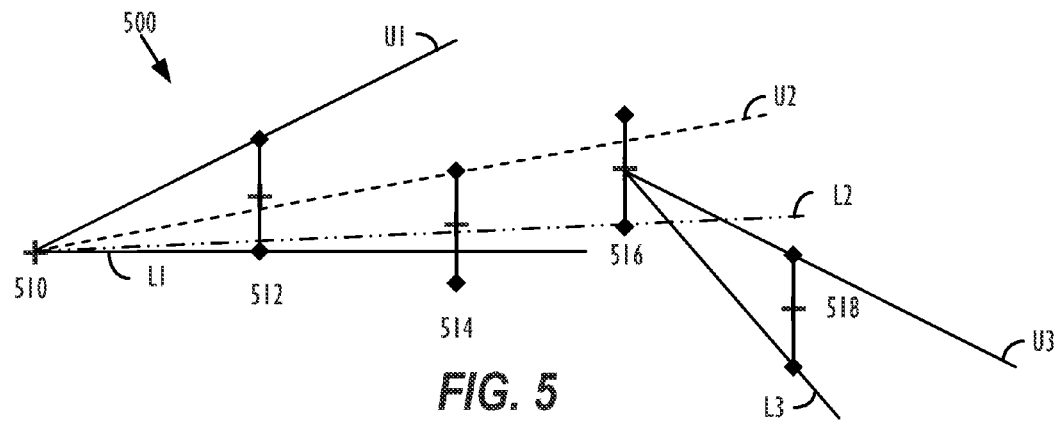
FIG. 5 illustrates an example timeline of metric data points being compressed by the disclosed compression system of FIG. 2 using a fan compression algorithm.

Timeline 500 in FIG. 5 shows how dynamic compression system 200 can apply fan interpolation of a SLIM3 compression algorithm to incoming data points. In this example, pre-compressor 230 has selected to apply fan interpolation to the incoming metric data based on the actual values themselves, associated metadata, or both, and compression system 200 uses the default behavior of the fan interpolator with a constant tolerance band.

As shown, a first data point 510 is received and is the starting point in this example. As the second point 512 arrives, the fan interpolator creates a fan having an upper fan limit U1 and a lower fan limit L1 that extend from first data point 510 to the upper and lower values (512+E and 512−E) of the second data point 512's threshold band (with E being the maximum tolerance allowed in the compression). When the third data point 514 then arrives, its upper threshold 514+E lies within the existing fan limits U1/L1, but its lower threshold 514−E does not. Therefore, the fan interpolator modifies the fan so that upper fan limit U2 meets the compression tolerance band of this third data point 514. After adjustment, the third data point 514 still lies within the modified fan limits U2/L1. Therefore, the second data point 512 can be safely disregarded and not stored, because it can be properly "compressed" or filtered out by meeting the tolerance criteria of the fan interpolation.

When the fourth data point 516 arrives, its lower threshold 516−E lies within the existing fan limits U2/L1, but its upper threshold 516+E does not. Therefore, the fan interpolator modifies the fan so that lower fan limit L2 meets the compression tolerances of this fourth point 516. Because the fourth data point 516 lies within the modified fan limits U2/L2, the third data point 514 does not need to be retained because it can be properly "compressed" or filtered out by meeting the tolerance criteria of the fan interpolation. Finally, the arriving fifth data point 518 and its thresholds fall out of the fan limits U2/L2. Consequently, the last compliant data point 516 is stored, and a new fan emanating from point 516 is started as indicated by new upper and lower fan limits U3/L3 extending through the fifth point's upper threshold 518+E and lower threshold 518−E.

As the previous fan interpolation shows, existing fan limits are modified based on the incoming values, and previous data points can be disregarded as long as the previous data point lies within the modified fan. This process reduces the number of data points that must be stored and maintains a maximum tolerance between the interpolated fan limits and the values collected in between.

In the previous examples, the tolerance band for any data point remained constant (data point value±E). As an alternative to such fixed tolerance bands, dynamic compression system 200 can decide upper and lower band thresholds for each incoming value. In this alternative, the tolerance band can be defined by the incoming value±E for absolute deviations or by the incoming value±(R*value) for relative deviation bands.

In the default fan interpolator of FIG. 5, for example, the resulting compression ratio depends on the particular tolerance level E that is used. If E=1, for example, then it will be appreciated that this compression ratio will be less effective if first point 510 has a value of "10" as opposed to a value of "100,000," especially if the Signal-to-Noise Ratio (SNR) for the data points is a percentage of the measured values. Instead of defining the tolerance band as a fixed x±E, pre-compressor 230 defines tolerance band as x±(x*R), with R being a relative precision defined on the tolerance band, so that compressor 240 can use a dynamically changing deadband having relative precision.

Figure 6:
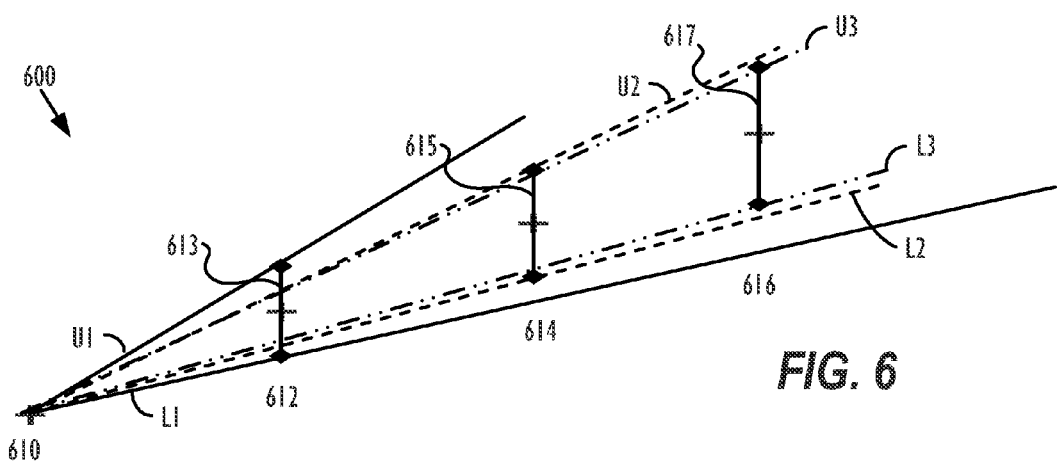
FIG. 6 illustrates an example timeline of metric data points for which relative precision tolerance bands are used.

To illustrate how the relative precision R can be used to define the tolerance bands of data points when compressing metric data, FIG. 6 illustrates an example timeline of metric data points for which relative precision tolerance bands are used. In FIG. 6, pre-compressor 230 has selected a fan compression algorithm (e.g., SLIM) to compress the incoming metric data by compressor 240. In addition, pre-compressor 230 has determined a relative precision R to use with the tolerance band for the algorithm as opposed to a constant tolerance band used as a default.

As shown in FIG. 6, a first data point 610 is received and is the starting point in this example. As second point 612 arrives, the fan compressor creates a fan having an upper fan limit U1 and a lower fan limit L1 that extend from first data point 610 to the upper and lower tolerance values of the second data point's tolerance band 613. Subsequent incoming data points 612, 614, and 616 have increasing values and lie within the modified fan limits U1/L1, U2/L2, etc. In contrast to default fan compression, second data point's tolerance band 613 is less than third data point's tolerance band 615 that is itself less than fourth data point's tolerance band 617. In this case, the tolerance bands for the data points depend on the reported value and the relative precision. Therefore, the higher the incoming value is the greater the tolerance band is, and visa-versa.

Using the relative precision, the principles associated with fan compression still apply, but the tolerance band for each data point is changed based on the relative precision R defined on the band as x±(x*R). For example, with R=1%, the tolerance range of value 100 will be [99,101], the tolerance range of value 1000 will be [990, 1010]. The same rule of "reliability of data" still applies, in that that every raw data point will lay within 1% of the interpolated line between any two endpoints that describe the trend that the compressed data follows. Ultimately, using the relative precision still allows the fan compression algorithm to discard various incoming data point that are properly "compressed" or filtered out by meeting the tolerance criteria of the fan interpolation.

In addition to changing the deadband in real-time based on relative precision, dynamic compression system 200 can change the deadband using variable tolerance bands and still achieve compression. For example, pre-compressor 220 may vary the tolerance band of the incoming metric data during run-time based on an evaluation of rules 260 applied to the values of the metric data and associated metadata 270. In turn, compressor 240 can receive the variable tolerance band with the metric data and selected compression algorithm 230 and perform the compression accordingly.

Figure 7:
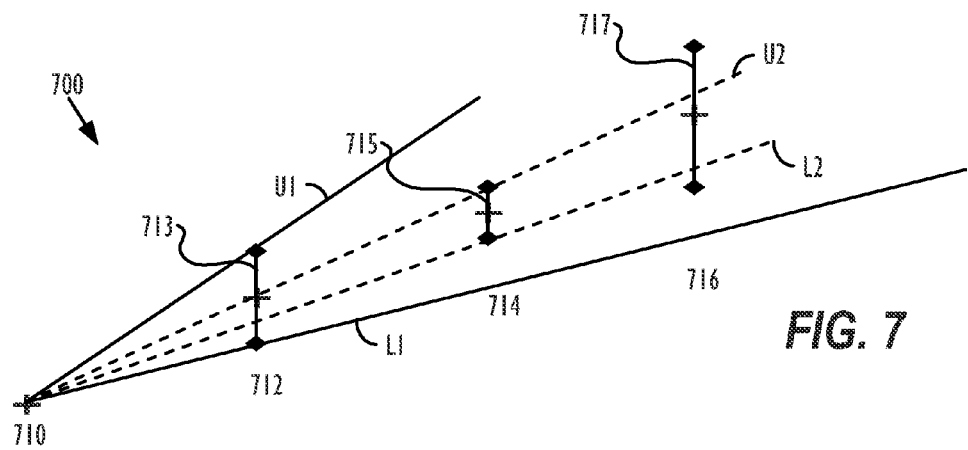
FIG. 7 illustrates an example timeline of metric data points for which for which variable tolerance bands are used.

In FIG. 7, an example timeline 700 of metric data points shows how variable tolerance bands are used along with fan interpolation as in SLIM3 compression. Data point 710 is the starting point for fan interpolation, and tolerance band 713 for second data point 712 are used to interpolate the fan limits U1 and L1. In contrast to default fan compression, third data point's tolerance band 715 is smaller than second and fourth data points' tolerance bands 713 and 717. In this example, compression is still possible by allowing the fan compression algorithm to discard various incoming data point that are properly "compressed" or filtered out by meeting the tolerance criteria of the fan interpolation.

As the above disclosure indicates, the challenges associated with data compression in an enterprise computing environment can be overcome by dynamically selecting compression settings according to the data being collected. This approach avoids the large configuration overhead typical of deadband compression systems while maintaining the benefits of data quality and high compression ratios. This approach also addresses the problem where the signal-to-noise ratio is relative to the value reported. The flexibility of being able to define different compression settings for different data ranges allows a more generic compression to be defined. At the same time, allowing the deadband size to increase or decrease, as the input value gets higher or lower, results in compression which appropriate to the incoming value. This flexibility is needed when managing data of unknown origin and when the data values may represent abnormal spikes (e.g. large increases or decreases over a short time period).

To aid in the understanding of this disclosure, the following definitions are provided. A "deadband" is a band in which data can be considered redundant. By defining a deadband, a compression algorithm has some room for ignoring data points that fall on or near a line. An "absolute deadband" defines a maximum allowed tolerance as a value±the deadband. For example, if the absolute deadband is 1, the tolerance band around the value 5 would be the range [4-6]. A "relative deadband" defines a maximum allowed tolerance as a value±the (value*relative deadband). For example, if the relative deadband is 2%, the tolerance band around the value 100 would be [98-102]. "Number of significant digits deadband" is another way of describing a deadband. For example, if the number of significant digits is 3, the tolerance band around the value 9986 would be [9980-9990].

As noted previously, the disclosed dynamic compression system can use various compression algorithms, which will be briefly discussed below. Zero-Order-Hold or straight (horizontal) line compression stores the first and last data points for those data points falling on a horizontal line. Linear Compression or (First order extrapolation) will remove redundant data points on any straight extrapolated line.

Box Car Back Slope algorithm uses a deadband and determines whether to compress data if it falls in a "boxcar window" (horizontal band) or in a "back slope window" (first order extrapolation). Details related to BOX CAR SLOPE can be found in the publication Hale J. C. and H. L. Sellars (1981), "Historical Data Recording For Process Computers," Chemical Engineering Progress, 37, no. 11 and in the publication J. Pettersson and P. O. Gutman, "Automatic Tuning of the Window Size in the Box Car Backslope Data Compression Algorithm," Proceedings of the $7^{th}$ Mediterranean Conference on Control and Automation (MED99) Haifa, Israel (1999), both of which are incorporated herein by reference.

Swinging door compression addresses complexity issues with the Box Car Back Slope algorithm. For example, swinging door is a way to overcome the Box Car back slope deficiencies by creating a band starting from the first data point that arrived. As a result, a corridor will be created that optimally contains as much data points as possible to provide the most effective filtering. Details related to SWINGING DOOR can be found in U.S. Pat. Nos. 4,669,097 & 5,774,385 to E. H. Bristol, both of which are incorporated herein by reference.

"Straight Line Interpolation Methods" (SLIM) use fan interpolation and has three well known variations SLIM1, SLIM2, and SLIM3. SLIM1 uses fan interpolation to maximize compression, and it stores pseudo-points (interpolated data points) to achieve this maximum compression. Just like with swinging door, the compressor/filter only has to keep track of the fan as it closes, and no historical data points need to be kept. SLIM2 is similar to SLIM1 except that it records the actual previous value and time whenever a new point's tolerance band falls outside the "fan". SLIM3 is very much like SLIM1, but it stores only "actual" values and does not store pseudo-points. Details related to the SLIM compression algorithms can be found in the publication C. M. Kortman, "Redundancy Reduction—A Practical Method of Data Compression," Proceedings of the IEEE, 55(3), March 1967, pp. 253-263 and in the publication P. A. James, "Data Compression For Process Historians," Chevron Research and Technology Company (1995), both of which are incorporated herein by reference.

Figure 1:
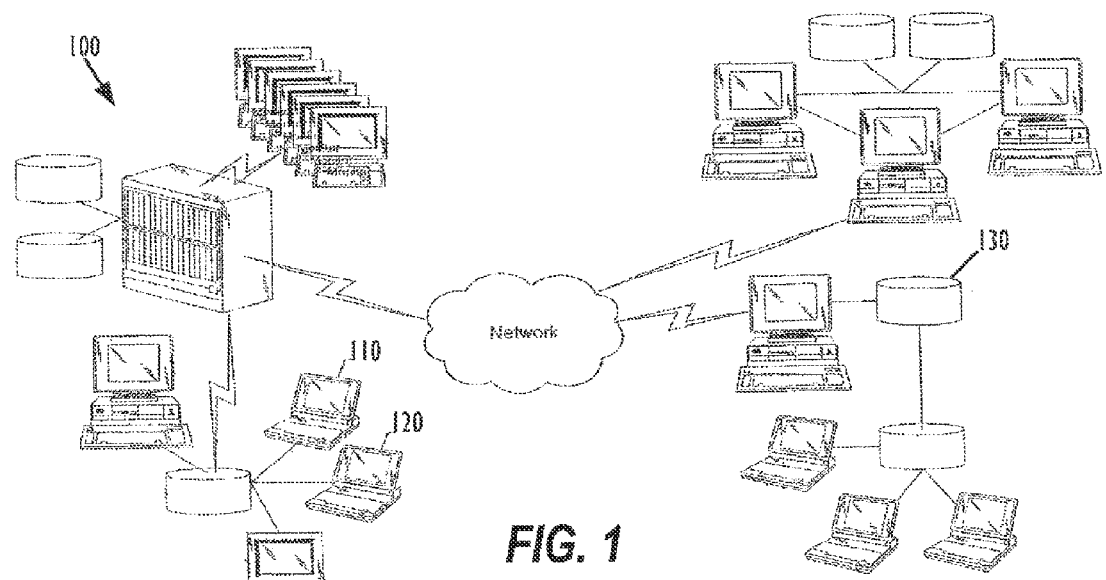
FIG. 1 illustrates an enterprise system environment.

Various changes in the details of the illustrated operational methods are possible without departing from the scope of the following claims. For instance, the disclosed compression system 200 can perform the identified steps of the process 100 of FIG. 1 and described elsewhere in an order different from that disclosed herein. Alternatively, some embodiments may combine the activities described herein as being separate steps. Similarly, one or more of the described steps may be omitted, depending upon the specific operational environment in which the method is being implemented.

It will be recognized by those of ordinary skill in the art that, given the benefit of this disclosure, the implementation of the disclosed technique may be appropriate for many other system environments and possibly many other styles of compression where the collection and maintenance of large amounts of historical or real-time data may be required. In addition, acts in accordance with this disclosure may be performed by a programmable control device executing instructions organized into one or more program modules. A programmable control device may be a single computer processor, a special purpose processor (e.g., a digital signal processor, "DSP"), a plurality of processors coupled by a communications link or a custom designed state machine. Custom designed state machines may be embodied in a hardware device such as an integrated circuit including, but not limited to, application specific integrated circuits ("ASICs") or field programmable gate array ("FPGAs"). Storage devices suitable for tangibly embodying program instructions include, but are not limited to: magnetic disks (fixed, floppy, and removable) and tape; optical media such as CD-ROMs and digital video disks ("DVDs"); and semiconductor memory devices such as Electrically Programmable Read-Only Memory ("EPROM"), Electrically Erasable Programmable Read-Only Memory ("EEPROM"), Programmable Gate Arrays and flash devices.

The foregoing description is presented to enable any person skilled in the art to make and use the invention as claimed and is provided in the context of the particular examples discussed below, variations of which will be readily apparent to those skilled in the art. Accordingly, the claims appended hereto are not intended to be limited by the disclosed embodiments, but are to be accorded their widest scope consistent with the principles and features disclosed herein.

What is claimed is:

1. A system management data compression method, comprising:
    receiving metric data used in management of a computing system, the metric data defining a single stream of time series data and having a first portion and a second portion;
    evaluating the first portion of the metric data with one or more rules before compressing the first portion of the metric data, the one or more rules being associated with compression of time series data;
    selecting a first data compression algorithm based on the evaluation of the first portion of the metric data;
    compressing the first portion of the metric data with the selected first data compression algorithm;
    evaluating the second portion of the metric data with the one or more rules before compressing the portion of the second metric data;
    selecting a second data compression algorithm based on the evaluation of the second portion of the metric data; and
    compressing the second portion of the metric data with the selected second data compression algorithm.

2. The method of claim 1, further comprising analyzing operations of one or more system components associated with the received metric data based on compressed metric data.

3. The method of claim 1, wherein the selecting the first data compression algorithm based on the evaluation of the first portion of the metric data includes dynamically adjusting settings used in the selected first data compression algorithm for the first portion of the metric data.

4. The method of claim 3, wherein the dynamically adjusting settings is performed based on a tolerance band defined by a relative precision applied to each data point value of the received metric data.

5. The method of claim 1, wherein the one or more rules is configured to trigger switching of compression algorithms at a designated time.

6. The method of claim 1, wherein the compressing the second data compression algorithm is delayed until the switching of algorithms is permitted based on the received metric data.

7. The method of claim 1, further comprising:
    receiving feedback information from a compressor, the evaluating of the first portion of the metric data is performed based on the received feedback information.

8. The method of claim 1, wherein selecting the second data compression algorithm is a null compression algorithm selected in response to the second portion of the metric data crossing a threshold value.

9. The method of claim 1, further comprising dynamically tuning the first data compression algorithm before the selecting the second data compression algorithm by using previous data values or data types.

10. The method of claim 1, wherein the compressing the first portion of the metric data with the first selected compression algorithm includes discarding at least a portion of the received metric data included within a tolerance band and storing at least a portion of the received metric data outside of the tolerance band.

11. A program storage device, readable by a programmable control device, comprising instructions stored thereon for causing the programmable control device to perform acts in accordance with claim 1.

12. A system management data compression method, comprising:
   receiving metric data used in management of a computing system, the metric data defining a single stream of time series data and having a first portion and a second portion;
   compressing the first portion of the metric data with a first compression algorithm;
   evaluating the second portion of the metric data with one or more rules associated with compression of time series data;
   switching to a second compression algorithm based on the evaluation; and
   compressing the second portion of the metric data with the second compression algorithm.

13. The method of claim 12, wherein the switching to the second compression algorithm based on the evaluation includes adjusting a tolerance band used in the second compression algorithm.

14. The method of claim 13, wherein the tolerance band is defined by a relative precision applied to each data point value of the second portion of the metric data.

15. The method of claim 13, wherein the switching of compression algorithms is delayed by a compressor until the switching of algorithms is permitted based on the received metric data.

16. The method of claim 12, further comprising preventing switching from the second compression algorithm to a third compression algorithm based on data values of the metric data.

17. The method of claim 12, wherein switching to the second compression algorithm based on the evaluation comprises using an input data point as both a last data point for a first compression sequence and a first data point for a subsequent compression sequence.

18. A program storage device, readable by a programmable control device, comprising instructions stored thereon for causing the programmable control device to perform acts in accordance with claim 12.

19. A compression system, comprising:
   an interface receiving metric data used in management of a computing system;
   memory having a data store, a plurality of rules, and a plurality of compression algorithms; and
   a processor operatively coupled to the interface and the memory, the processor programmed to perform acts in accordance with claim 1.

20. A compression system, comprising:
   an interface receiving metric data used in management of a computing system;
   memory having a data store, a plurality of rules, and a plurality of compression algorithms; and
   a processor operatively coupled to the interface and the memory, the processor programmed to perform acts in accordance with claim 12.

21. The method of claim 1, wherein the metric data is associated with a single parameter.

22. The method of claim 1, wherein the first portion of the metric data is measured during a first time period and the second portion of the metric data is measured during a second time period after the first time period.

23. The method of claim 1, wherein the first portion of the metric data includes a plurality of data values separate from metadata characterizing the first portion of the metric data, the selecting the first data compression algorithm is performed based on combination of the metadata and the data values.

24. The method of claim 1, wherein the first data compression algorithm has a compression ratio different than a compression ratio of the second data compression algorithm.

25. The method of claim 1, wherein the first data compression algorithm is a non-mandatory compression algorithm subject to delayed implementation and the second data compression algorithm is a mandatory compression algorithm that is immediately implemented.

26. The method of claim 1, wherein the first portion of the metric data includes a plurality of values separate from metadata characterizing the first portion of the metric data, the selecting the first data compression algorithm is performed based on the metadata indicating that the metric data is associated with at least one of a percentage or a status.

27. The method of claim 1, wherein at least a portion of the first portion of the metric data compressed by the first compression algorithm overlaps with at least a portion of the second portion of the metric data compressed by the second compress algorithm.

* * * * *